(12) United States Patent
Nakashima et al.

(10) Patent No.: US 6,404,478 B1
(45) Date of Patent: Jun. 11, 2002

(54) LIQUID CRYSTAL DISPLAY HAVING CAPACITORS ON A SUBSTRATE WITH EQUAL RESISTANCE CONDUCTORS ELECTRICALLY CONNECTING THE CAPACITORS TO A CHIP

(75) Inventors: Takayuki Nakashima; Hiroo Mochida; Hideki Hayashi; Yoshihiro Ikefuji, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/000,522

(22) Filed: Dec. 4, 2001

(30) Foreign Application Priority Data

Dec. 4, 2000 (JP) ........................................ 2000-368207
Dec. 4, 2000 (JP) ........................................ 2000-368208

(51) Int. Cl.$^7$ ............................................. G02F 1/1335
(52) U.S. Cl. ........................ 349/149; 349/151; 349/152
(58) Field of Search ............................ 349/151; 345/98, 345/99, 100

(56) References Cited

U.S. PATENT DOCUMENTS 4,145,120 A  * 3/1979 Kubota ........................ 349/151
5,847,783 A  * 12/1998 Hiramoto et al. ............ 349/151
5,870,163 A  * 2/1999 Watanabe et al. ............ 349/149
6,285,432 B1 * 9/2001 Phillips ........................ 349/149

FOREIGN PATENT DOCUMENTS

JP          033802       2/2001     ......... G02F/1/1345

* cited by examiner

*Primary Examiner*—James Dudek
(74) *Attorney, Agent, or Firm*—Michael D. Bednarek; Shaw Pittman LLP

(57) ABSTRACT

A liquid crystal display includes a compact LC panel. The LC panel includes transparent front and rear plates between which a liquid crystal layer is disposed. The rear plate has a projecting portion which avoids facing the front plate. The projecting portion carries a semiconductor chip for display control and two capacitors cooperating with the semiconductor chip. One of the capacitors, first capacitor, is located farther from the semiconductor chip than the other or second capacitor is. A first conductor is provided for connecting the first capacitor to the semiconductor chip, and a second conductor is provided for connecting the second capacitor to the same chip. The first and the second conductors are made substantially equal in electrical resistance.

9 Claims, 11 Drawing Sheets

LIQUID CRYSTAL DISPLAY HAVING CAPACITORS ON A SUBSTRATE WITH EQUAL RESISTANCE CONDUCTORS ELECTRICALLY CONNECTING THE CAPACITORS TO A CHIP

BACKGROUND OF THE INVENTION

1. Field of the invention

The present invention relates to a liquid crystal display (LCD). More particularly, it relates to a liquid crystal panel incorporated in an LCD.

2. Description of the Related Art

As known in the art, a liquid crystal display incorporates an LC panel which may typically be made up of two glass plates (front glass and rear glass), a liquid crystal layer disposed between the glass plates, a polarizer, etc. When the LC panel is of the simple matrix type, a number of transparent electrodes are formed on each glass plate. The electrodes on one glass plate may extend horizontally, while the electrodes on the other glass plate may extend vertically. Thus, when the two glass plates are assembled, the mutually perpendicular electrodes provide a great number of intersections each of which serves as a pixel.

To control the LC panel, use may be made of a number of electric devices including a semiconductor chip, voltage-boosting or voltage-regulating capacitors, etc. These devices may individually be mounted on the rear glass plate of the LC panel. For facilitating the mounting operation, the front glass plate may be made smaller than the rear glass plate. With this arrangement, the rear glass plate has a projecting portion that does not overlap any part of the front glass plate. It is possible to mount the above-mentioned devices onto this projecting portion without undergoing any interference with the front glass plate.

In the above LCD, the semiconductor chip may be connected to the capacitors by a wiring pattern formed on the rear glass plate. For improved efficiency of the fabrication process, this wiring pattern and the transparent electrodes on the rear glass plate may be made simultaneously with the use of the same conductive material.

While the prior art LCD is functional, it has the following drawbacks.

As noted above, the chip-capacitor connecting pattern is preferably made of the same material used for making the transparent electrodes on the rear glass plate. In general, a conductive material used for making such transparent electrodes has rather high resistivity. Thus, if the connecting pattern has a long current passage connecting the semiconductor chip and one of the capacitors, the voltage drop along the passage may be unduly large. Unfavorably, this may hinder proper voltage supply to the semiconductor chip from the capacitor.

One way to address the above problem is to arrange the capacitor close to the semiconductor chip, thereby reducing the resistance of the current passage. In this case, the remaining capacitors also need to be disposed near the semiconductor chip, so that they can equally enjoy the advantage of the shortened current passage. In addition, all the capacitors are spaced equidistantly (or substantially equidistantly) from the semiconductor chip (see FIG. 14), so that the current passages from the respective capacitors to the semiconductor chip have the same resistance (hence the same voltage drop).

With the above arrangements, however, a rather wide region is required on the projecting portion of the rear plate to accommodate all the capacitors arranged in an array (FIG. 14). Disadvantageously, such a layout leads to an increase in the projection amount L, which in turn may cause an increase in overall size of the product LCD.

SUMMARY OF THE INVENTION

The present invention has been proposed under the circumstances described above. It is, therefore, an object of the present invention to provide an LCD in which a properly high driving voltage can be constantly applied to the control semiconductor chip without rendering the product LCD bulky and heavy.

According to a first aspect of the present invention, a liquid crystal display is provided, which includes: a first transparent plate; a second transparent plate having a projecting portion that avoids facing the first transparent plate; a liquid crystal layer disposed between the first and the second transparent plates; a semiconductor chip mounted on the projecting portion for display control; a first capacitor mounted on the projecting portion; a second capacitor mounted on the projecting portion, the second capacitor being spaced from the chip by a distance which is greater than a distance between the first capacitor and the chip; a first conductive element extending between the first capacitor and the chip for electrical connection; and a second conductive element extending between the second capacitor and the chip for electrical connection. The first and the second conductive elements are equal in resistance.

Preferably, the first conductive element may be a strip having a first width, and the second conductive element may be a strip having a second width greater than the first width.

Preferably, the liquid crystal display may further include a third conductive element for connecting the first capacitor to the chip, wherein the second conductive element is disposed between the first and the third conductive elements.

Preferably, the liquid crystal display of the present invention may further include a third capacitor and a fourth conductive element. The third capacitor is spaced from the chip by a distance equal to the distance between the second capacitor and the chip. The fourth conductive element connects the third capacitor to the chip. The fourth conductive element is connected to both the second and the third capacitors.

Preferably, the semiconductor chip may have a side surface facing the first capacitor. The second and the third capacitors are aligned to each other along an imaginary line extending in parallel to the above side surface of the chip.

Preferably, the liquid crystal display of the present invention may further include a fourth capacitor spaced from the chip by a distance equal to the distance between the first capacitor and the chip. The distance between the first and the fourth capacitors is greater than the distance between the second and the third capacitors.

Preferably, the liquid crystal display of the present invention may further include a transparent electrode pattern formed on the second transparent plate. The first and second conductive elements and the electrode pattern are made of the same conductive material.

According to a second aspect of the present invention, an electric module is provided, which includes a support; a reference device mounted on the support, the reference device being provided with a first connection pad and a second connection pad; a first cooperative device spaced from the reference device by a first distance; a second cooperative device spaced from the reference device by a second distance which is greater than the first distance; a first conductive element for connecting the first cooperative device to the first pad of the reference device, the first conductive element including both a first base end attached to the first pad and a first extension attached to the first cooperative device, the first base end being greater in width than the first extension; and a second conductive element for connecting the second cooperative device to the second pad of the reference device, the second conductive element including both a second base end attached to the second pad and a second extension attached to the second cooperative device, the second base end being smaller in width than the second extension. The first extension is substantially equal in resistance to the second extension.

Preferably, the electric module of the present invention may further include a package for enclosing the first and the second cooperative devices.

Other features and advantages of the present invention will become apparent from the detailed description given below with reference to the accompanying drawings.

DETAILED DESCRIPTION OF THE PREFERRED EMBODIMENT

The preferred embodiments of the present invention will be described below with reference to the accompanying drawings.

Figure 1:
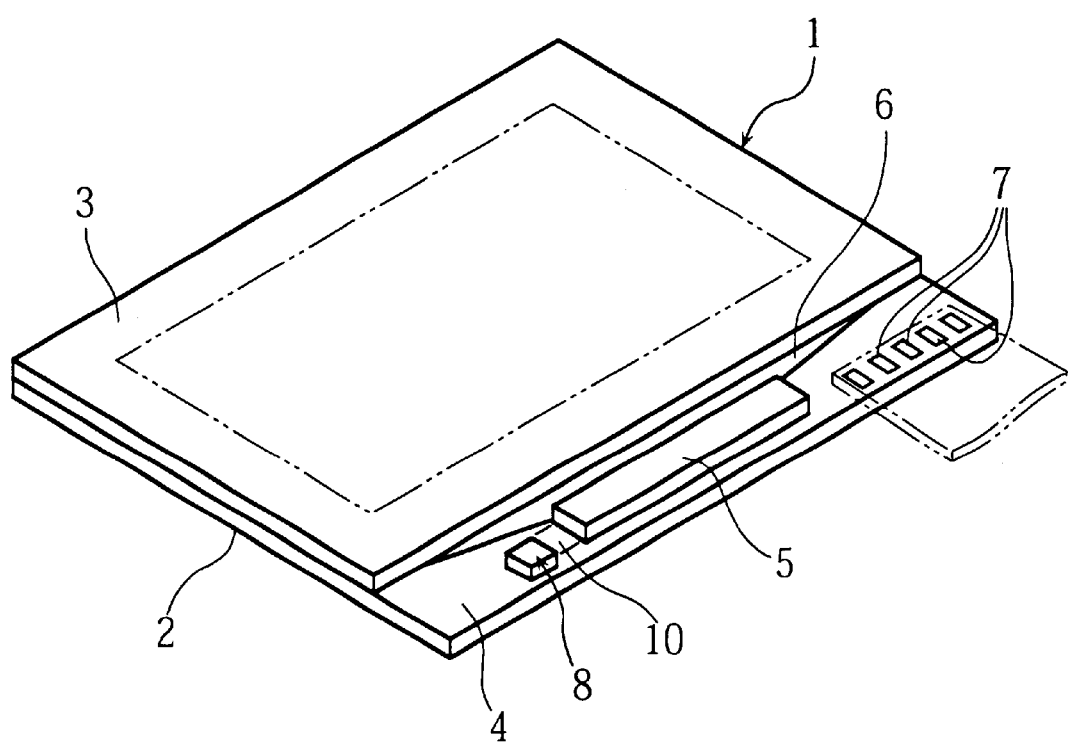
FIG. 1 is a perspective view showing a liquid crystal display (LCD) according to a first embodiment of the present invention.

Reference is first made to FIGS. 1–5 illustrating a liquid crystal display (LCD) 1 according to a first embodiment of the present invention. The LCD 1 includes a first transparent plate 2, a second transparent plate 3 and a liquid crystal layer (not shown) disposed between the first plate 2 and the second plate 3. The first and the second plates 2, 3 are rectangular and made of an insulating material. In FIG. 1, the display area is shown by a rectangle depicted in double-dot chain lines.

As shown in FIG. 1, the first plate 2 is larger than the second plate 3, whereby a rectangular portion 4 of the first plate 2 projects from the second plate 3. The projecting portion 4 carries a semiconductor chip 5 for controlling image display and a capacitor array 8 for e.g. voltage-boosting. The projecting portion 4 is formed with a wiring pattern 6 for connecting the chip 5 to transparent electrodes (not shown) formed on the first and the second plates 2, 3. Further, the projecting portion 4 is provided with a prescribed number of terminals 7 for connecting the chip 5 to an external unit (not shown).

Figure 2:
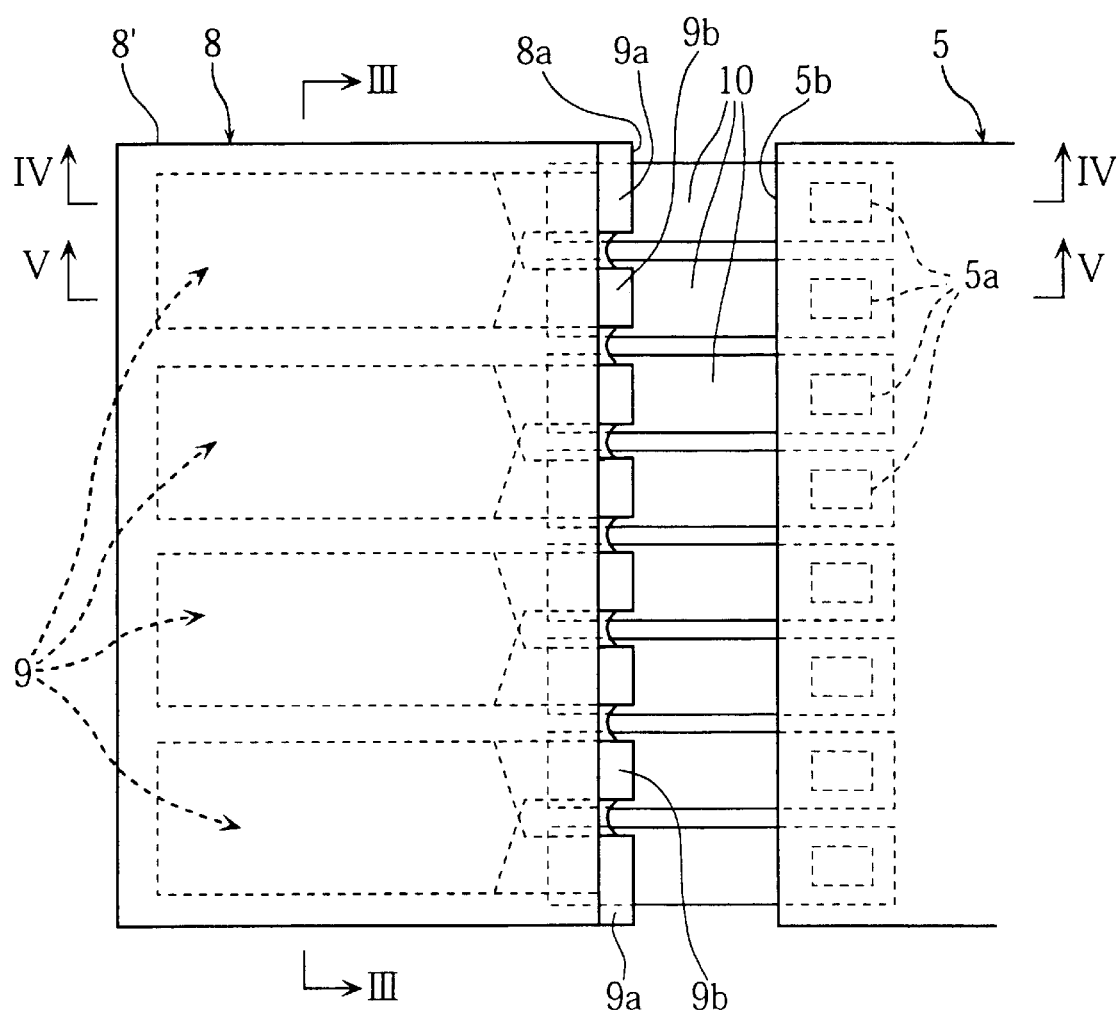
FIG. 2 is an enlarged plan view showing a wiring pattern used for connecting the capacitor array to the semiconductor chip of the LCD of the first embodiment.
Figure 3:
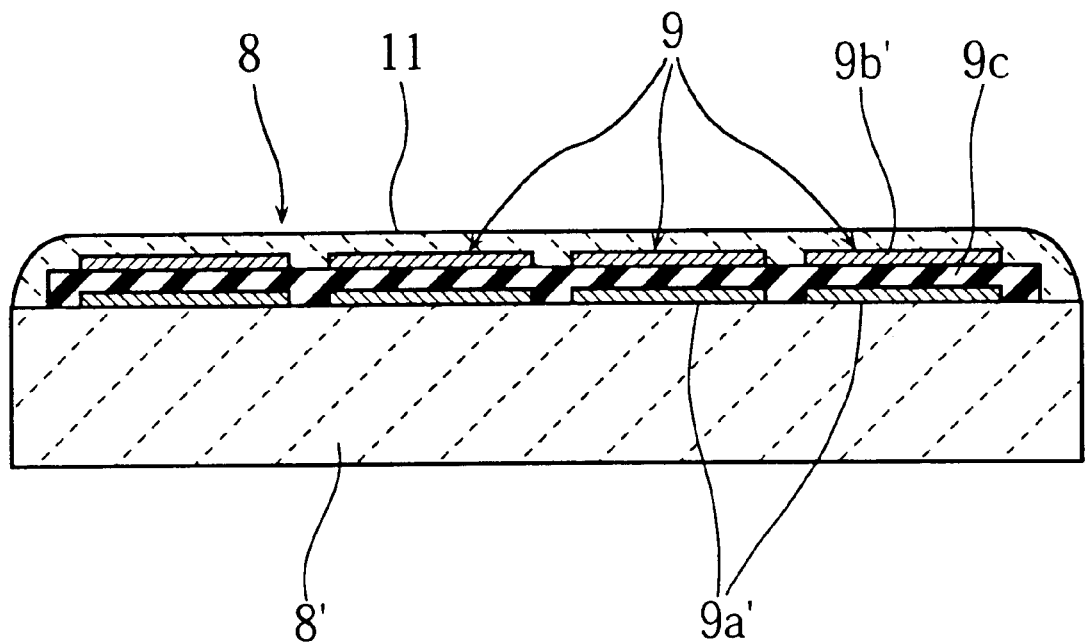
FIG. 3 is a sectional view taken along lines III—III in FIG. 2.
Figure 4:
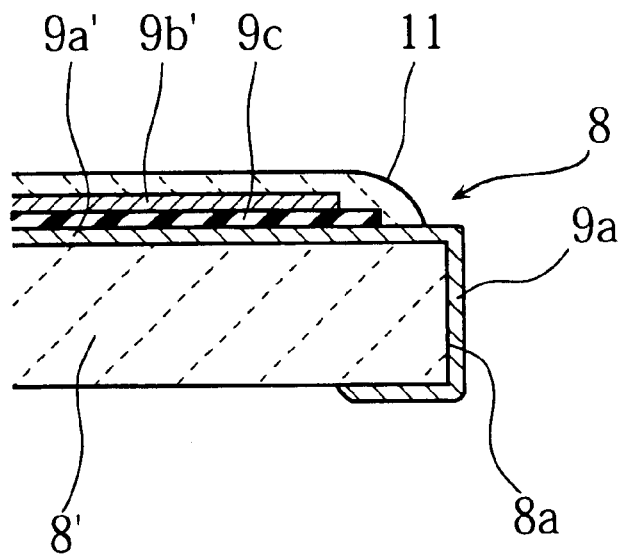
FIG. 4 is a sectional view taken along lines IV—IV in FIG. 2.
Figure 5:
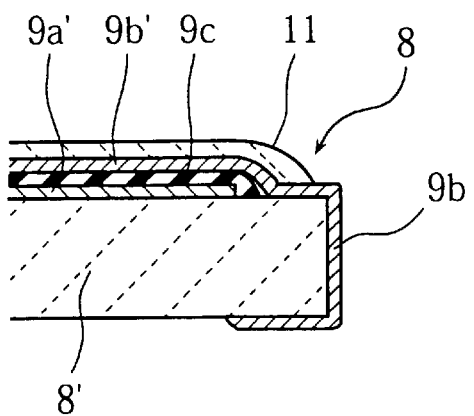
FIG. 5 is a sectional view taken along lines V—V in FIG. 2.

As shown in FIGS. 2–5, the capacitor array 8 includes a chip substrate 8'(see FIG. 3 in particular) and four capacitors 9 provided on the substrate 8'. The substrate 8' is made of a heat-resistant insulating material such as ceramic. Each of the capacitors 9 is made up of a lower electrode 9a' (formed directly on the substrate 8'), an intermediate dielectric layer 9c and an upper electrode 9b'. As shown in FIGS. 2 and 4–5, each capacitor 9 is provided with first and second terminals 9a–9b extending on one side surface 8a of the substrate 8' and further onto the bottom surface of the substrate 8'. The first terminal 9a is connected to the lower electrode 9a' (FIG. 4), while the second terminal 9b is connected to the upper electrode 9b' (FIG. 5). The capacitors 9 are covered by a protection coating 11.

As seen from FIG. 2, the bottom surface of the semiconductor chip 5 is provided with four pairs of connection pads 5a disposed adjacent to one side surface 5b of the chip 5. As illustrated, the side surface 5b of the chip 5 is held in close facing relation to the above-mentioned side surface 8a of the capacitor array 8. The first and the second terminals 9a–9b of each capacitor 9 are connected to one of the pairs of the pads 5a via a wiring pattern 10 formed on the projecting portion 4. In the illustrated embodiment, the wiring pattern 10 is composed of eight conductive strips having the common prescribed width and length.

The above-mentioned two wiring patterns 6 (FIG. 1) and 10 (FIG. 2) are produced simultaneously with the non-illustrated transparent pixel-defining electrodes of the first transparent plate 2 with the use of the same conductive material. In this manner, the production of the wiring patterns 6 and the transparent electrodes can be performed efficiently.

In the above embodiment, use is made of anisotropic conductive film (not shown) for bonding the wiring pattern 6 to the chip 5 and for bonding the wiring pattern 10 to the pads 5a of the chip 5 and to the terminals 9a, 9b of the respective capacitors 9.

According to the above embodiment, the four capacitors 9 are integrated into a single unit (capacitor array 8), and this unit is mounted onto the projecting portion 4. In this manner, it is easy and does not take much time to incorporate the capacitors into the circuit of the LCD. Further, the four capacitors 9 do not have an individual protection coating (which tends to be rather bulky) but only are coated with a common protection layer 11. Therefore, the integrated capacitors 9 (i.e., the capacitor array 8) do not take up much room on the projecting portion 4 in comparison with the instance where the four capacitors, each being coated with an individual protection layer, are mounted one by one onto the projecting portion 4.

Still further, with the above-described arrangement, the wiring pattern 10 can be advantageously short due to the close facing relation between the side surface 5b of the chip 5 (adjacent to which the pads 5a are provided) and the side surface 8a of the capacitor array 8 (over which the terminals 9a, 9b extend).

Figure 6:
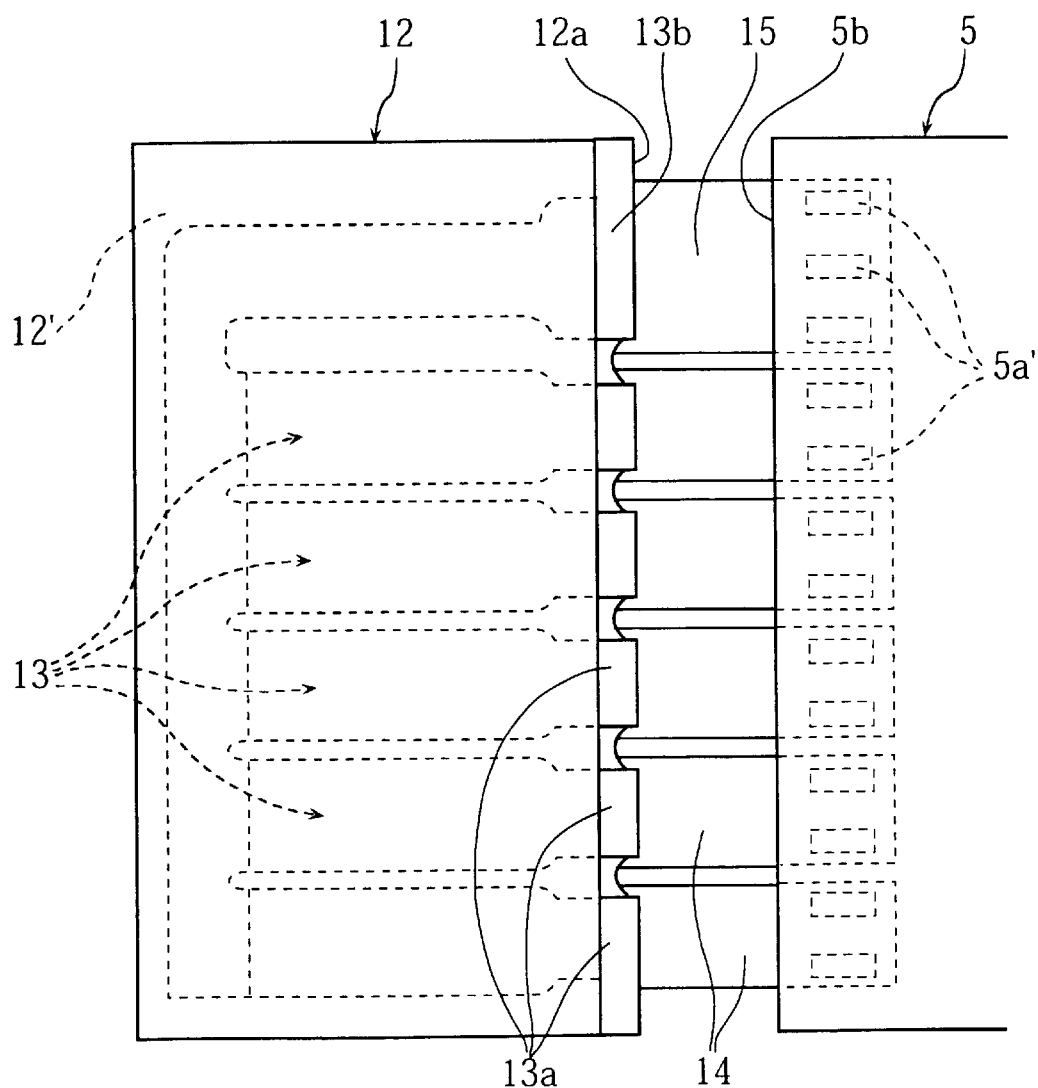
FIG. 6 is a plan view showing a modified arrangement for connecting a capacitor array to a semiconductor chip used for the CD of the present invention.

Reference is now made to FIG. 6 showing a modified version of a capacitor array used for the LCD of the present invention. The illustrated capacitor array 12 includes an insulating chip substrate 12' and five voltage-regulating capacitors 13 supported by the substrate 12'. Each of the capacitors 13 has a terminal 13a of its own that extends over one side surface 12a of the substrate 12'. As the counterpart terminal, the respective capacitors 13 have a common terminal 13b which also extends over the above side surface 12a. (Thus, for the five capacitors 13, five terminals 13a and one terminal 13b are provided.)

The semiconductor chip 5 is formed with connection pads 5a' at its bottom surface. In the illustrated embodiment again, the pads 5a' are arranged adjacent to a side surface 5b of the chip 5 that is held in close facing relation to the side surface 12a of the substrate 12'. The pads 5a' of the chip 5 are connected to the terminals 13a or 13b of the capacitor array 12 via a wiring pattern formed on the projecting portion 4 (see FIG. 1). As illustrated in FIG. 6, the wiring pattern (generally unnumbered) includes five relatively narrow strips 14 connected to the individual terminals 13a and one relatively wide strip 15 connected to the common terminal 13b.

Figure 7:
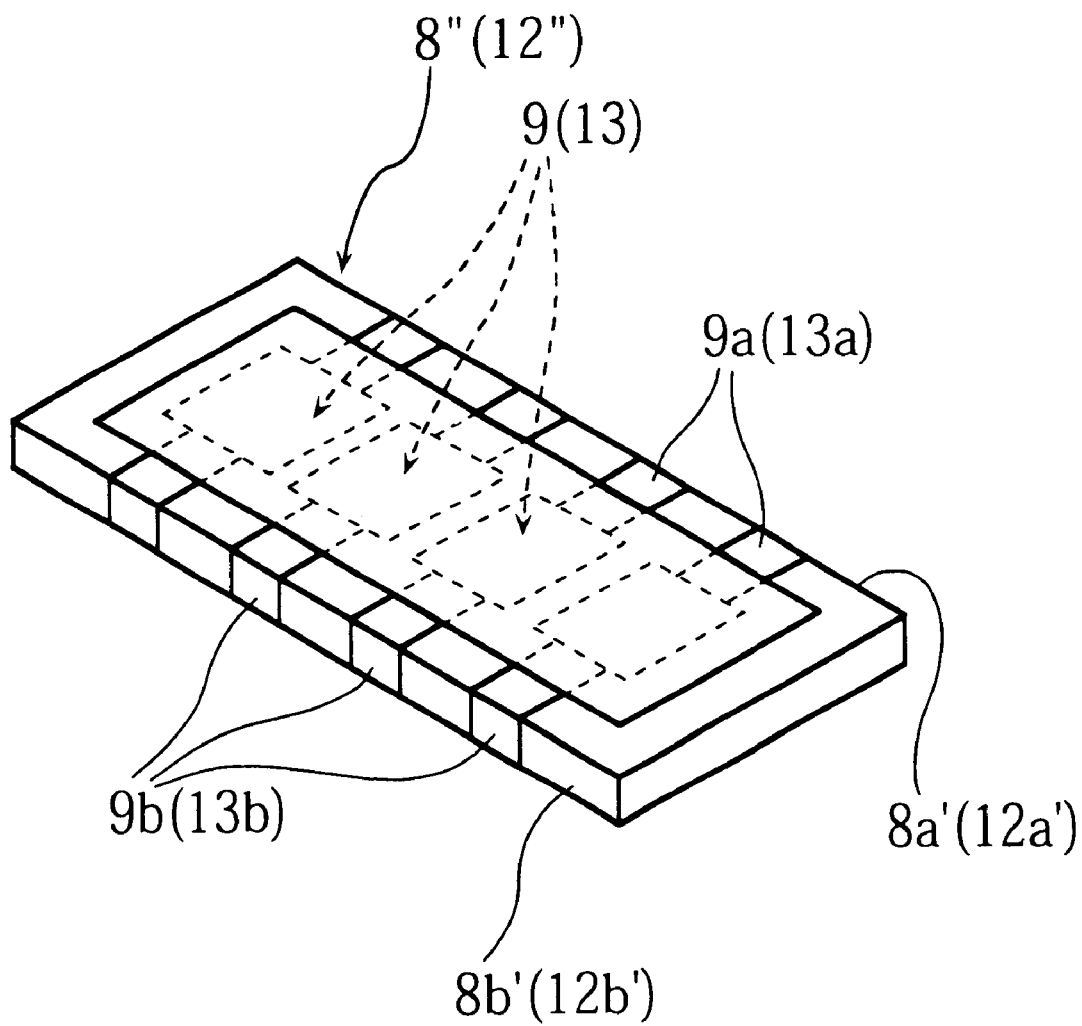
FIG. 7 is a perspective view showing a capacitor array usable for the LCD of the present invention.

In the above two examples shown in FIGS. 2 and 6, all the terminals of the capacitor array (8 or 12) are collected at one side of the chip substrate (8' or 12'). The present invention, however, is not limited to this particular arrangement. For instance, as shown in FIG. 7, two terminals 9a–9b(or 13a–13b) of each capacitor 9 (or 13) may be separately disposed at opposite side surfaces 8a'–8b' (or 12a'–12b') of a capacitor array 8" (or 12").

Figure 8:
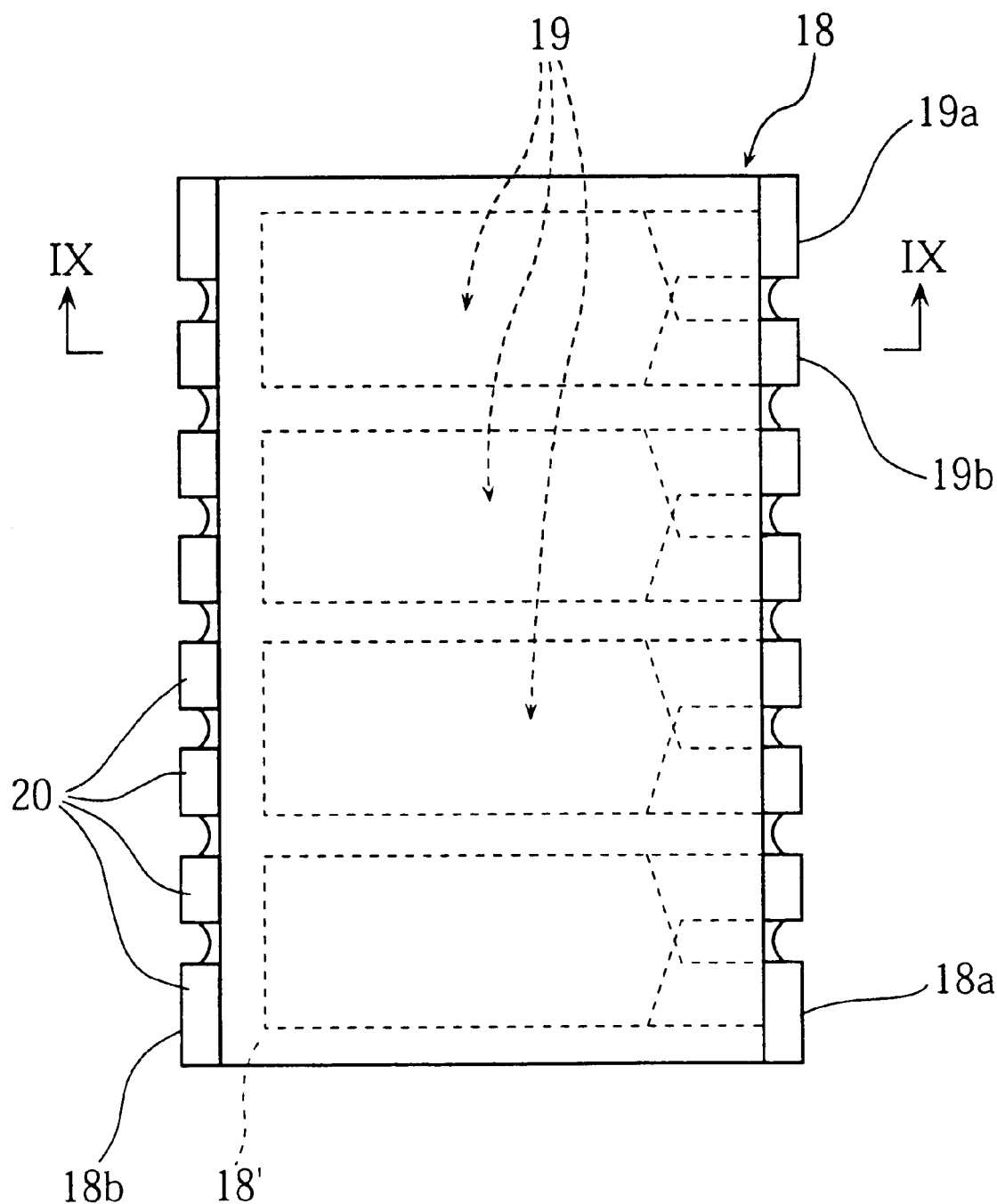
FIG. 8 is a plan view showing a modified capacitor array provided with dummy electrodes for stable mounting.
Figure 9:
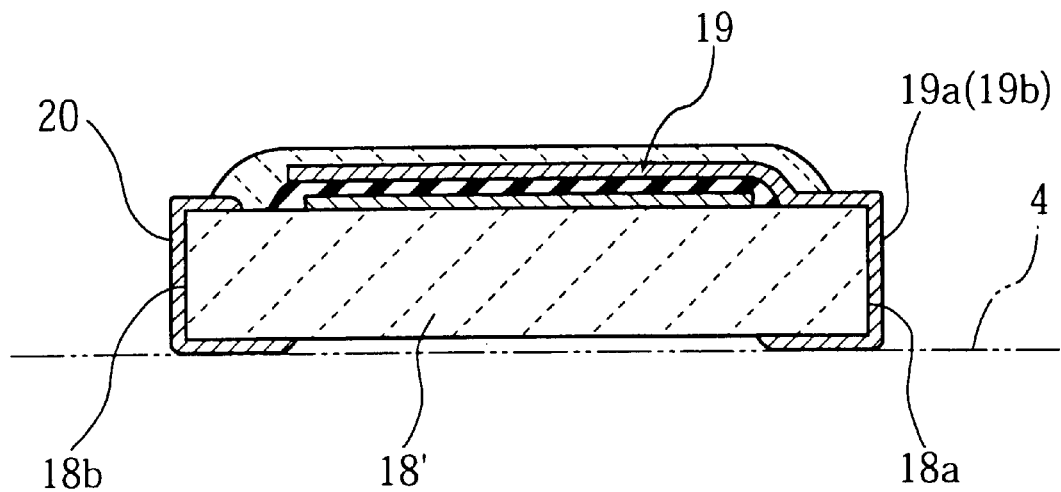
FIG. 9 is a sectional view taken along lines IX–IX in FIG. 8.

Further, according to the present invention, use may be made of dummy terminals 20, as shown in FIGS. 8 and 9. Specifically, the illustrated capacitor array 18 includes a chip substrate 18' and voltage-regulating or voltage-boosting capacitors 19 provided on the substrate 18'. As best shown in FIG. 9, each capacitor 19 is provided with a pair of terminals 19a'19b which extends over one side surface 18a of the substrate 18' and further onto the bottom surface of the substrate 18'. At the opposite side surface 18b of the substrate 18', the capacitor array 18 is provided with dummy terminals 20. As best shown in FIG. 9, each dummy terminal 20 extends onto the bottom and head surfaces of the substrate 18'. The dummy terminal 20 and the functional terminal 19a(19b) are generally symmetrical in cross section (FIG. 9) with respect to the vertical center line (not shown) of the substrate 18'.

With the above arrangement, it is possible to mount the capacitor array 18 on the projecting portion 4 in a parallel position relative to the mounting surface of the projecting portion 4. Accordingly, the functional terminals 19a, 19b of the respective capacitors 19 are properly connected to the wiring pattern.

Figure 10:
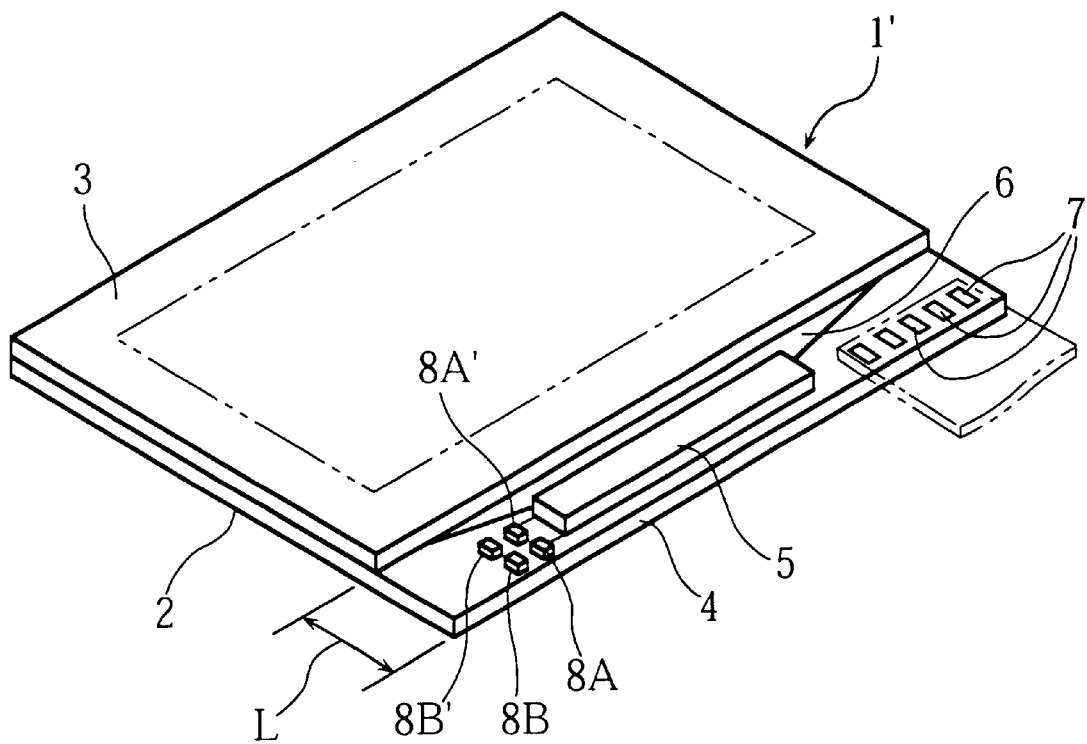
FIG. 10 is a perspective view showing a liquid crystal display according to a second embodiment of the present invention.
Figure 11A:
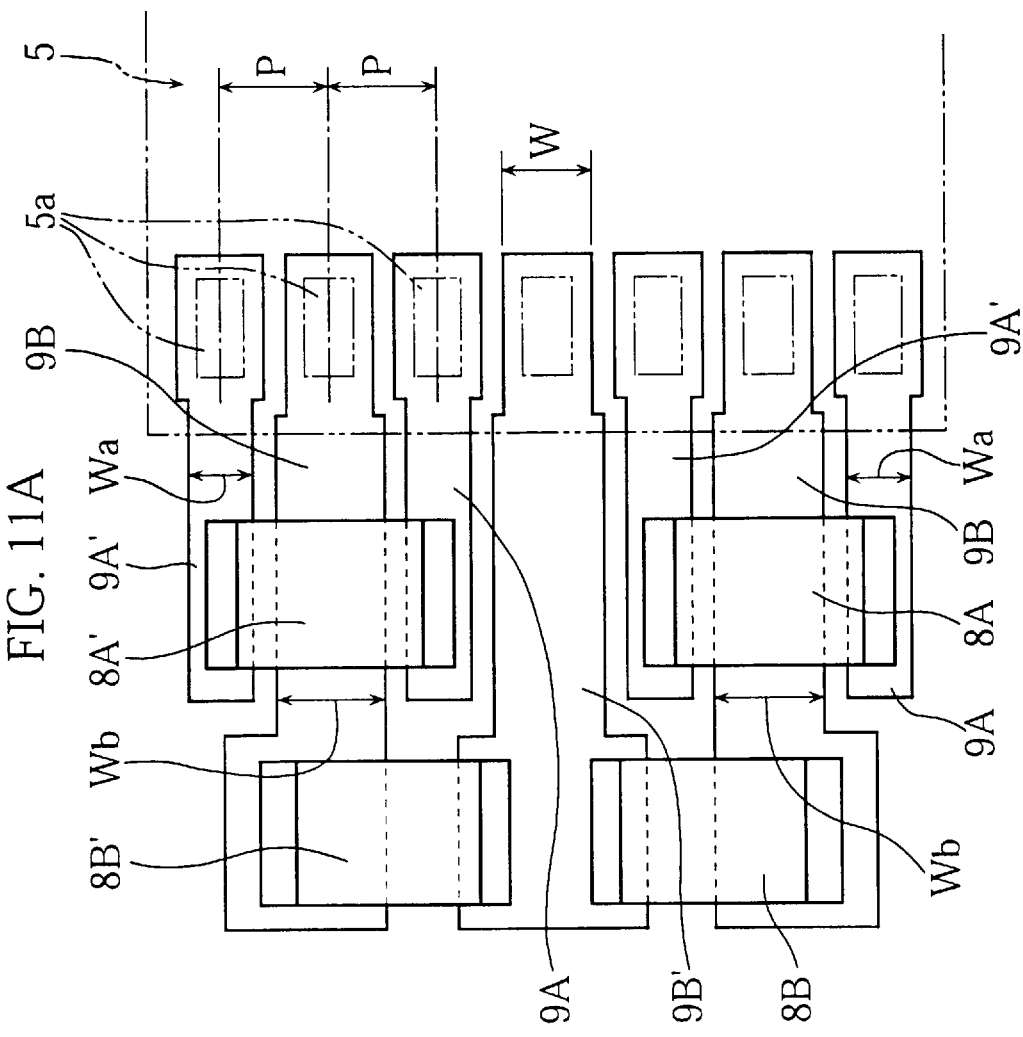
FIG. 11A is a plan view showing a wiring pattern for connecting capacitors to a semiconductor chip of the second embodiment.
Figure 11B:
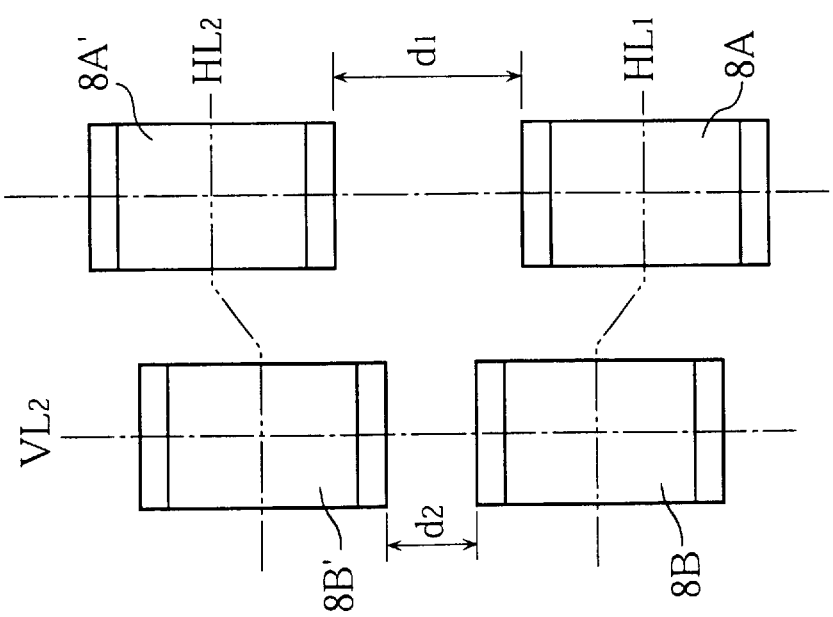
FIG. 11B is a plan view showing only the layout of the capacitors of FIG. 11A.

Reference is now made to FIGS. 10 and 11A–11B illustrating an LCD 1' according to a second embodiment of the present invention. As in the first embodiment, the LCD 1' includes a larger transparent plate 2, a smaller transparent plate 3, a semiconductor chip 5 and a plurality of terminals 7 for connecting the chip 5 to an external unit. A liquid crystal layer (not shown) is disposed between the first and the second plates 2, 3. The first plate 2 includes a projecting portion 4 upon which the chip 5 and the terminals 7 are provided. Further, a wiring pattern 6 is formed on the projecting portion 4 for connecting the chip 5 to the non-illustrated transparent electrodes formed on the plates 2 and 3.

According to the second embodiment, a plurality of separate capacitors are mounted on the projecting portion 4 for e.g. applying required voltage to the chip 5. In the illustrated example, four capacitors 8A–8B and 8A'–8B' are depicted. As best shown in FIG. 11B, the four capacitors 8A–8B and 8A'–8B' are not arranged in a single array (as shown in FIG. 2 for example) but disposed in a grid-like pattern. Specifically, the capacitors 8A–8A' are aligned along a vertical line $VL_1$, while the other capacitors 8B–8B' are aligned along another vertical line $VL_2$ which is parallel to the line $VL_1$. The capacitors 8A–8A' are disposed closer to the chip 5 than the other capacitors 8B–8B' are. In relation to the capacitor 8A, the capacitor 8B is offset upward as shown by a horizontal line $HL_1$. The amount of the offset is smaller than half the length of the capacitor 8B. Likewise, the capacitor BB' is offset downward relative to the capacitor 8A', as shown by a horizontal line $HL_2$. As a result, the distance $d_2$ between the capacitors 8B–8B' is smaller than the distance $d_1$ between the capacitors 8A–8A'.

As shown in FIG. 11A, the semiconductor chip 5 is provided with seven connection pads 5a for the four capacitors 8A, 8A', 8B and 8B'. The pads 5a are disposed at regular intervals P. To connect the four capacitors to the seven pads, use is made of a wiring pattern formed on the projecting portion 4. This wiring pattern, as shown in FIG. 11A, includes four relatively short conductive strips 9A–9A' and three relatively long conductive strips 9B–9B'. The four short strips 9A–9A' are all identical, whereas the three long strips 9B–9B' are not (as shown in FIG. 11A, the center strip 9B' is slightly different in configuration from the other two strips 9B). The wiring pattern including these seven strips is formed simultaneously with the pixel-defining transparent electrodes for the first transparent plate 2 with the use of the same conductive material.

Figure 13:
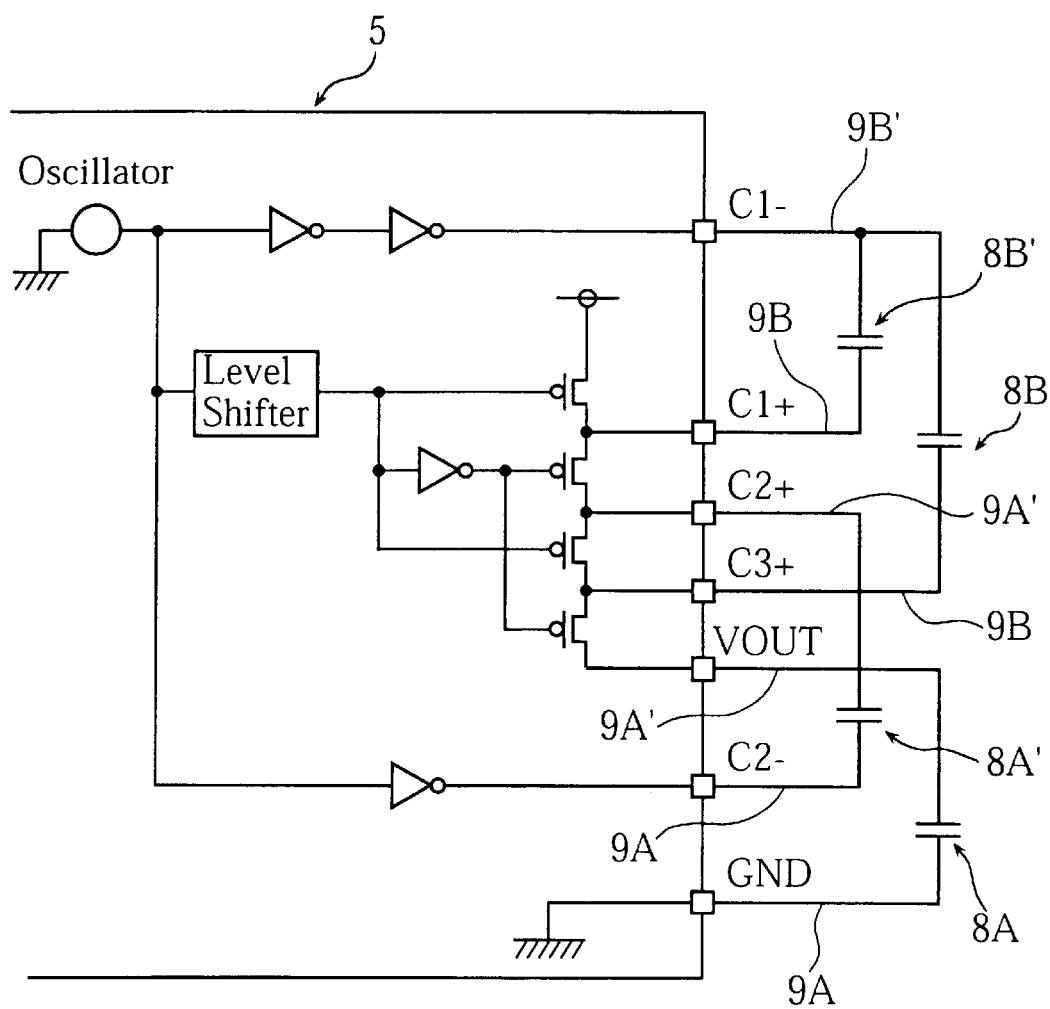
FIG. 13 is a diagram showing a voltage-regulating or voltage-boosting circuit used for an LCD of the present invention.

As shown in FIG. 11A, the shorter strips 9A–9A' are used for connecting the capacitors 8A–8A' to the relevant pads 5a, while the longer strips 9B–9B' are used for connecting the capacitors 8B–8B' to the relevant pads 5a. The shorter strips 9A–9A' have a functional width Wa, while the longer strips 9B–9B' have a functional width Wb which is greater than the width Wa. The pad-connecting portion of each shorter or longer strip has a reference width W which is greater than the width Wa but smaller than the width Wb. The widths Wa and Wb are determined so that the electric resistance of the shorter strip 9A or 9A' is equal (or substantially equal) to the electric resistance of the longer strip 9B or 9B'. In the illustrated example, any one of the longer strips 9B–9B' is arranged between two adjacent shorter strips 9A and 9A'. FIG. 13 shows the diagram of the voltage-boosting circuit composed of the semiconductor chip 5 and the capacitors 8A–8A' and 8B–8B'.

As in the first embodiment, all the capacitors 8A–A' and 8B–8B' of the second embodiment may be packaged together.

The advantage obtained from the capacitor layout shown in FIG. 11A will now be described below with reference to the comparative examples shown in FIGS. 14 and 15.

Figure 14:
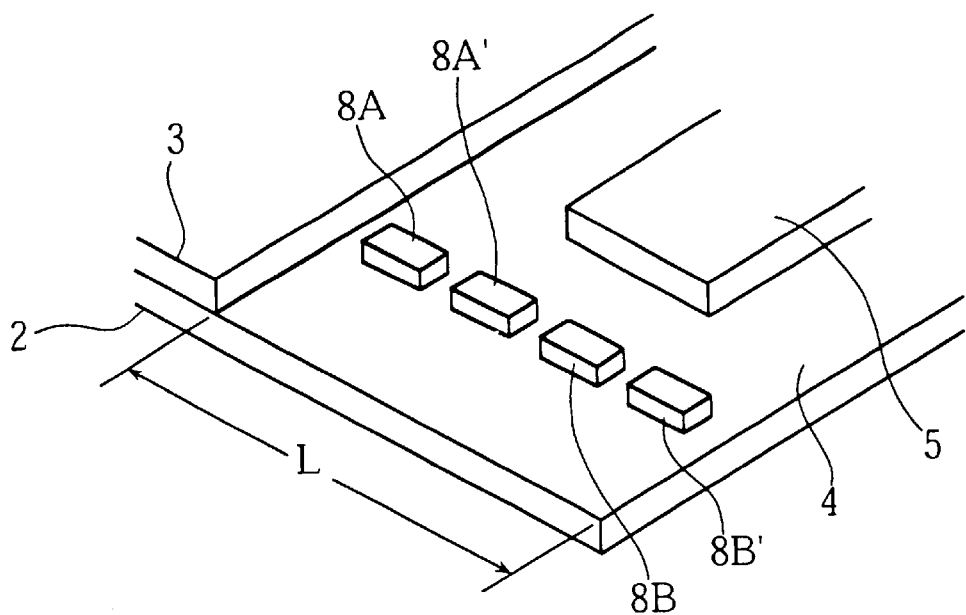
FIG. 14 is a perspective view showing a comparative layout of capacitors relative to the semiconductor chip of an LCD.
Figure 15:
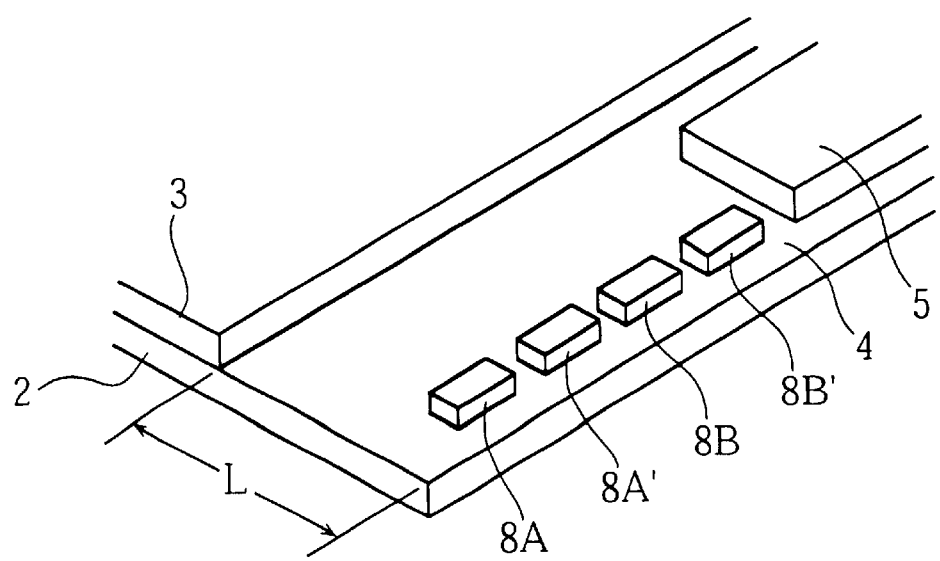
FIG. 15 is a perspective view showing another comparative layout of capacitors relative to the semiconductor chip of an LCD.

Specifically, when the capacitor layout of FIG. 14 is adopted, the projecting amount L of the portion 4 is unduly large. Accordingly, the overall size and weight of the LCD tend to become large and heavy. When the capacitor layer of FIG. 15 is adopted, the projecting amount L of the portion 4 can be small. In this example, however, the length of the conductive path from the capacitor 8A to the chip 5 is much greater than the length of the conductive path from the capacitor 8B' to the chip 5. Thus, the arrangement of FIG. 15 will give rise to an unfavorably large difference between the voltage drop along the path for the capacitor 8A and the voltage drop along the path for the capacitor 8B'.

According to the second embodiment described above (see FIG. 11A), the four capacitors 8A–8A' and 8B–8B' are not arranged in a single array but in a grid-like pattern. Thus, the projecting amount L of the portion 4 can be smaller than when the layout of FIG. 14 is adopted. In addition, the shorter strips 9A, 9A' and the longer strips 9B, 9B' are rendered equal in resistance. Thus, the voltage drops along these strips can be equalized. As a result, a proper voltage can be applied to the chip 5 from the capacitors 9A, 9A', 9B and 9B'.

Figure 12:
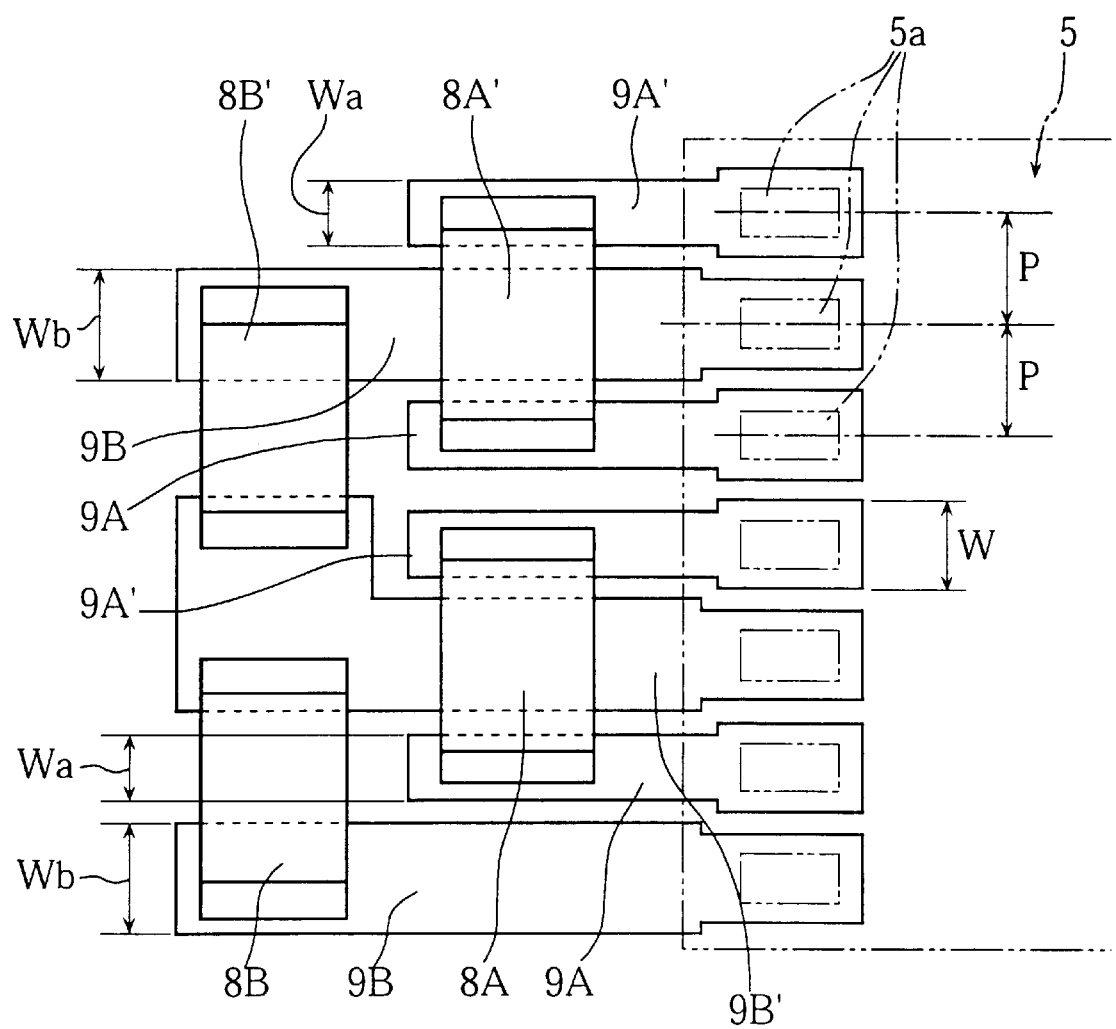
FIG. 12 is a plan view showing a modified wiring pattern for connecting the capacitors to the semiconductor chip of the second embodiment.

According to the present invention, the usable wiring pattern is not limited to the example shown in FIG. 11A. For instance, it may be configured into the one shown in FIG. 12. In this example, two central. shorter strips 9A–9A' are disposed together between an longer strip 9B (the uppermost one in FIG. 12) and the central longer strip 9B'. In either case (FIG. 11A or FIG. 12), the central longer strip 9B' is shared by two capacitors 8B and 8B'. This is advantageous to reducing the number of the longer strips to be used.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A liquid crystal display comprising:
    a first transparent plate;
    a second transparent plate having a projecting portion that avoids facing the first transparent plate;
    a liquid crystal layer disposed between the first and the second transparent plates;
    a semiconductor chip mounted on the projecting portion for display control;
    a first capacitor mounted on the projecting portion;
    a second capacitor mounted on the projecting portion, the second capacitor being spaced from the chip by a distance which is greater than a distance between the first capacitor and the chip;
    a first conductive element extending between the first capacitor and the chip for electrical connection; and
    a second conductive element extending between the second capacitor and the chip for electrical connection;
    wherein the first and the second conductive elements are equal in resistance.

2. The liquid crystal display according to claim 1, wherein the first conductive element comprises a strip having a first width, the second conductive element comprising a strip having a second width greater than the first width.

3. The liquid crystal display according to claim 1, further comprising a third conductive element for connecting the first capacitor to the chip, wherein the second conductive element is disposed between the first and the third conductive elements.

4. The liquid crystal display according to claim 1, further comprising a third capacitor and a fourth conductive element, the third capacitor being spaced from the chip by a distance equal to a distance between the second capacitor and the chip, the fourth conductive element connecting the third capacitor to the chip, wherein the fourth conductive element is shared by the second and the third capacitors.

5. The liquid crystal display according to claim 4, wherein the chip has a side surface facing the first capacitor, and wherein the second and the third capacitors are aligned to each other along an imaginary line extending in parallel to the side surface of the chip.

6. The liquid crystal display according to claim 4, further comprising a fourth capacitor spaced from the chip by a distance equal to a distance between the first capacitor and the chip, wherein a distance between the first and the fourth capacitors is greater than a distance between the second and the third capacitors.

7. The liquid crystal display according to claim 1, further comprising a transparent electrode pattern formed on the second transparent plate, wherein the first and the second conductive elements and the electrode pattern are made of a common conductive material.

8. An electric module comprising:
    a support;
    a reference device mounted on the support, the reference device being provided with a first connection pad and a second connection pad;
    a first cooperative device spaced from the reference device by a first distance;
    a second cooperative device spaced from the reference device by a second distance which is greater than the first distance;
    a first conductive element for connecting the first cooperative device to the first pad of the reference device, the first conductive element including both a first base end attached to the first pad and a first extension attached to the first cooperative device, the first base end being greater in width than the first extension; and
    a second conductive element for connecting the second cooperative device to the second pad of the reference device, the second conductive element including both a second base end attached to the second pad and a second extension attached to the second cooperative device, the second base end being smaller in width than the second extension;
    wherein the first extension is substantially equal in resistance to the second extension.

9. The electric module according to claim 8, further comprising a package for enclosing the first and the second cooperative devices.

* * * * *